(12) United States Patent
Röhr et al.

(10) Patent No.: US 6,351,422 B2
(45) Date of Patent: Feb. 26, 2002

(54) INTEGRATED MEMORY HAVING A DIFFERENTIAL SENSE AMPLIFIER

(75) Inventors: Thomas Röhr, Aschheim; Thomas Böhm, Zorneding; Heinz Hönigschmid, Starnberg; Georg Braun, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/820,235

(22) Filed: Mar. 28, 2001

Related U.S. Application Data

(63) Continuation of application No. PCT/DE99/02888, filed on Sep. 13, 1999.

(30) Foreign Application Priority Data

Sep. 28, 1998 (DE) ......................... 198 44 479

(51) Int. Cl.[7] ................................. G11C 7/00
(52) U.S. Cl. .................. 365/203; 365/205; 365/189.01
(58) Field of Search ......................... 365/203, 205, 365/189.01, 189.04, 145

(56) References Cited

U.S. PATENT DOCUMENTS

| | | |
|---|---|---|
| 5,241,503 A | 8/1993 | Cheng |
| 5,487,043 A | 1/1996 | Furutani et al. |
| 5,742,185 A | 4/1998 | Lee |
| 5,761,141 A | 6/1998 | Kobashi et al. |
| 5,828,612 A * | 10/1998 | Yu et al. ................. 365/203 |

FOREIGN PATENT DOCUMENTS

| | | |
|---|---|---|
| DE | 41 18 847 A1 | 12/1991 |
| DE | 42 28 212 A1 | 4/1993 |

* cited by examiner

*Primary Examiner*—David Nelms
*Assistant Examiner*—David Lam
(74) *Attorney, Agent, or Firm*—Herbert L. Lerner; Laurence A. Greenberg; Werner H. Stemer

(57) ABSTRACT

The memory has writable memory cells. In addition, it has a bit line pair which connects the memory cells MC to a differential sense amplifier. A control unit is used for precharging the bit lines in a plurality of steps before one of the memory cells is conductively connected to one of the bit lines for a read access operation. For a write access operation, the control unit carries out no more than some of the bit line precharging steps provided for a read access operation before the sense amplifier transfers data to the bit line pair.

6 Claims, 2 Drawing Sheets

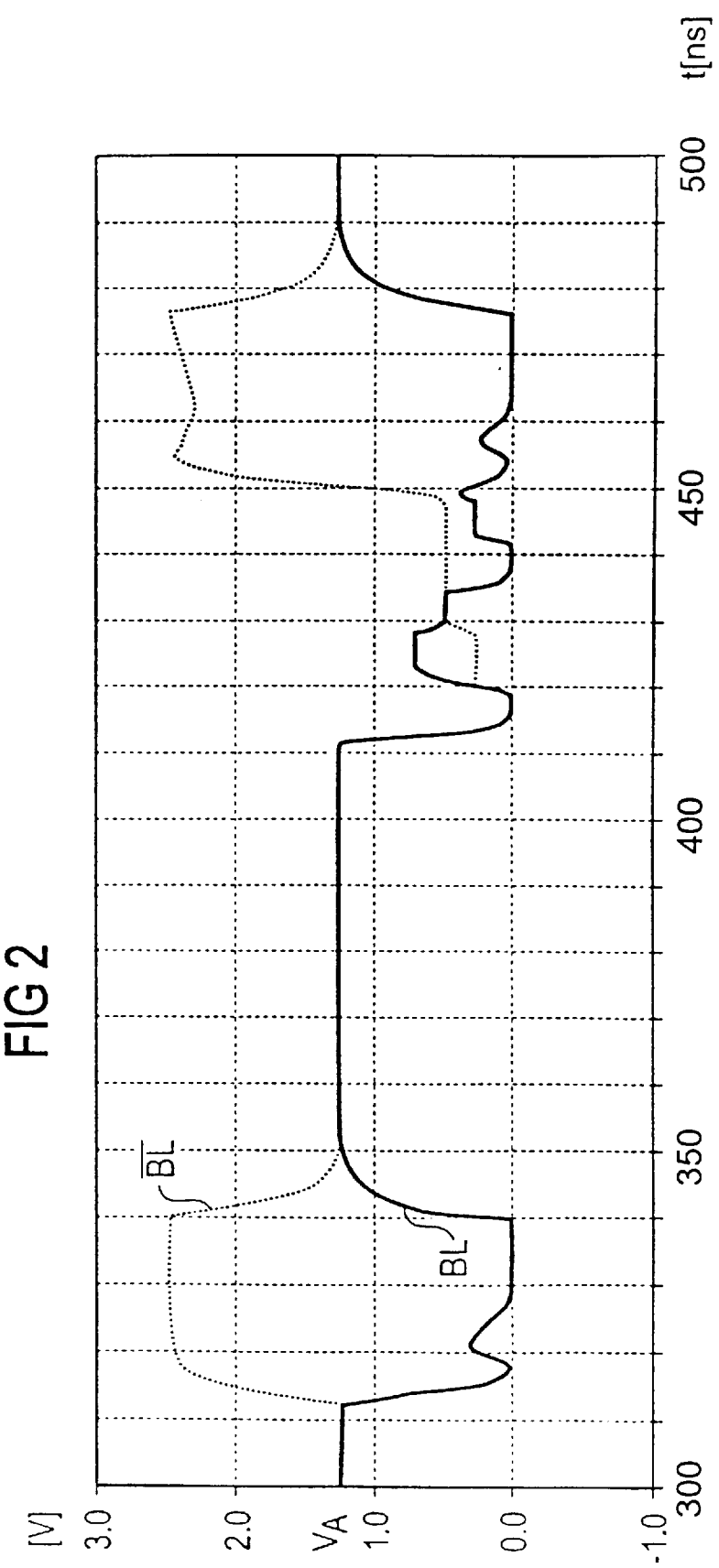

INTEGRATED MEMORY HAVING A DIFFERENTIAL SENSE AMPLIFIER

CROSS-REFERENCE TO RELATED APPLICATION

This application is a continuation of copending International Application No. PCT/DE99/02888, filed Sep. 13, 1999, which designated the United States.

BACKGROUND OF THE INVENTION

Field of the Invention

The invention lies in the integrated technology field. More specifically, the invention relates to an integrated memory having writable memory cells, a pair of bit lines which connect the memory cells to a differential sense amplifier that is used to transfer data which are to be read during a read access operation from the memory cells to outside the memory, and that is used to transfer data which are to be written during a write access operation from outside the memory to the memory cells. The integrated memory further has a control unit for precharging the bit lines in a plurality of steps before one of the memory cells is conductively connected to one of the bit lines for a read access operation.

Differential sense amplifiers are used, for example, in DRAMs and FRAMs (ferroelectric RAMs) for amplifying data read from memory cells and for writing data to the memory cells. U.S. Pat. No. 5,241,503 describes such a sense amplifier. It is connected to the memory cells by means of a bit line pair used to transfer a difference signal. Before a read access operation, the bit lines are precharged to particular potentials before one of the memory cells is conductively connected to one of the bit lines and influences the potential thereof. Next, the sense amplifier is activated, so that it amplifies the potential difference between the two bit lines, and the bit lines then have opposite logic levels. Since the memory cell content of a DRAM memory cell is lost when the memory cell is read (destructive reading), the signal amplified by the sense amplifier during read access is usually written back to the previously read memory cell. In this manner, the original memory state thereof is restored.

In a DRAM or FRAM, a write access operation differs only slightly from a read access operation. The main difference is that, for a read access operation, the sense amplifier forwards the amplified difference signal to outside the memory, whereas, for a write access operation, a difference signal corresponding to an item of data which is to be written is supplied from outside the memory to the sense amplifier, which sets appropriate potential states on the bit line pair connected to it. Both at the start of a read access operation and at the start of a write access operation, the bit lines are usually precharged in the same way, i.e. using the same steps. A write access operation and a read access operation therefore differ only in terms of whether, when the bit lines have been precharged, the sense amplifier transfers data supplied from outside the memory to the bit lines, or whether the sense amplifier amplifies the difference signal produced on the bit line pair when the memory cell is read and forwards it to the outside.

The execution just described for a write cycle and a read cycle in a DRAM or FRAM has the advantage that the control for precharging the bit lines and for conductively connecting the memory cells to one of the bit lines is effected in exactly the same way in both cases. Hence, a write access operation in the conventional memories with destructive reading takes just as long as a read access operation.

U.S. Pat. No. 5,487,043 discloses a memory in which bit lines are precharged to a precharge potential by means of a signal which carries out charge equalization at the same time using two transistors.

SUMMARY OF THE INVENTION

The object of the present invention is to provide an integrated memory with a differential read amplifier which overcomes the above-noted deficiencies and disadvantages of the prior art devices and methods of this general kind, and which allows fast write access to take place.

With the above and other objects in view there is provided, in accordance with the invention, an integrated memory, comprising:

writable memory cells;

a differential sense amplifier configured to transfer data read during a read access operation from the memory cells to outside the memory, and to transfer data to be written during a write access operation from outside the memory to the memory cells;

a pair of bit lines connecting the memory cells to the differential sense amplifier;

a control unit connected to the bit lines for precharging the bit lines in a given number of steps before one of the memory cells is conductively connected to one of the bit lines for a read access operation; and the control unit precharging the bit lines during a write access operation with fewer than the given number of steps before the sense amplifier transfers data to the bit line pair.

In other words, the integrated memory according to the invention has writable memory cells. It also has a pair of bit lines which connects the memory cells to a differential sense amplifier which is used to transfer data which are to be read during a read access operation from the memory cells to outside the memory, and which is used to transfer data which are to be written during a write access operation from outside the memory to the memory cells. In addition, it has a control unit for precharging the bit lines in a plurality of steps before one of the memory cells is conductively connected to one of the bit lines for a read access operation. For a write access operation, the control unit carries out no more than some of the bit line precharging steps provided for a read access operation before the sense amplifier transfers data to the bit line pair.

Since the precharging of the bit lines which is carried out for a read access operation is dispensed with either completely or at least partly for a write access operation, a write access operation is advantageously obtained which requires less time for its execution than for executing a read access operation. The memory according to the invention can thus be written to faster than conventional memories.

The invention can be used generally for writable integrated memories containing differential amplifiers.

In accordance with an added feature of the invention, memory cell contents of the memory cells are destroyed, i.e., erased, during a read access operation; and the sense amplifier amplifies a difference signal established on the bit line pair when the memory cell has been conductively connected to the bit line during the read access operation, and then writes the difference signal back to the memory cell.

In this development, the memory cell contents of the memory cells are erased during a read access operation, that is to say that destructive reading is involved. During a read access operation, the sense amplifier amplifies the difference signal established on the bit line pair when the memory cell has been conductively connected to the bit line, and then writes it back to the memory cell.

Memories with destructive read access operations are DRAMs and FRAMs, for example. In these memories, the memory access operation is terminated by writing data to the memory cells, both in the case of reading and in the case of writing. According to the invention, for a write access operation, no more than some of the steps required for precharging the bit lines during a read access operation are executed for a write access operation. This means that a write access operation differs from the read access operation in terms of the precharging steps preceding the writing which takes place for both types of access.

In accordance with an additional feature of the invention, the control unit, in order to precharge the bit lines for the read access operation, precharges both bit lines of the bit line pair to a common potential, and the common potential is dispensed with for the write access operation.

In accordance with another feature of the invention, the control unit performs two operations for the read access operation for precharging the bit lines, including reading out reference memory cells onto the bit lines and then performing a charge equalization between the bit lines, but both operations are dispensed with for a write access operation.

In accordance with a further feature of the invention, the control unit, in order to precharge the bit lines for the read access operation, discharges the bit line connected to the memory cell which is to be read, the discharge being effected subsequently to the charge equalization between the bit lines and being dispensed with for the write access operation.

In accordance with a concomitant feature of the invention, during the read access operation, the respective the memory cell is read by conductively connecting the memory cell to one of the bit lines before the sense amplifier is activated; and during a write access operation, the sense amplifier is activated first, so that data to be written are already present on the bit line pair before the respective the memory cell is conductively connected to one of the bit lines.

In accordance with the further development of the invention, during a read access operation, the respective memory cell is read by conductively connecting it to one of the bit lines before the sense amplifier is activated. In addition, during a write access operation, the sense amplifier is activated first, so that data which are to be written are already present on the bit line pair before the respective memory cell is conductively connected to one of the bit lines.

Hence, whereas read access takes place as in conventional DRAMs or FRAMs, for a write access operation, the sense amplifier is activated first before the memory cell is conductively connected to one of the bit lines. This has the advantage that, following activation of the sense amplifier and the associated possible charge reversal on the bit line, there is no need to wait as long until the respective memory cell is actually conductively connected to the appropriate bit line. To write an item of data to one of the memory cells after the sense amplifier has been activated, it is then sufficient for the memory cell to be briefly conductively connected to the appropriate bit line.

Other features which are considered as characteristic for the invention are set forth in the appended claims.

Although the invention is illustrated and described herein as embodied in an integrated memory having a differential sense amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 a graph showing signal profiles on bit lines of FIG. 1 during a write access operation and during a read access operation.

DESCRIPTION OF THE PREFERRED EMBODIMENTS

Figure 1:
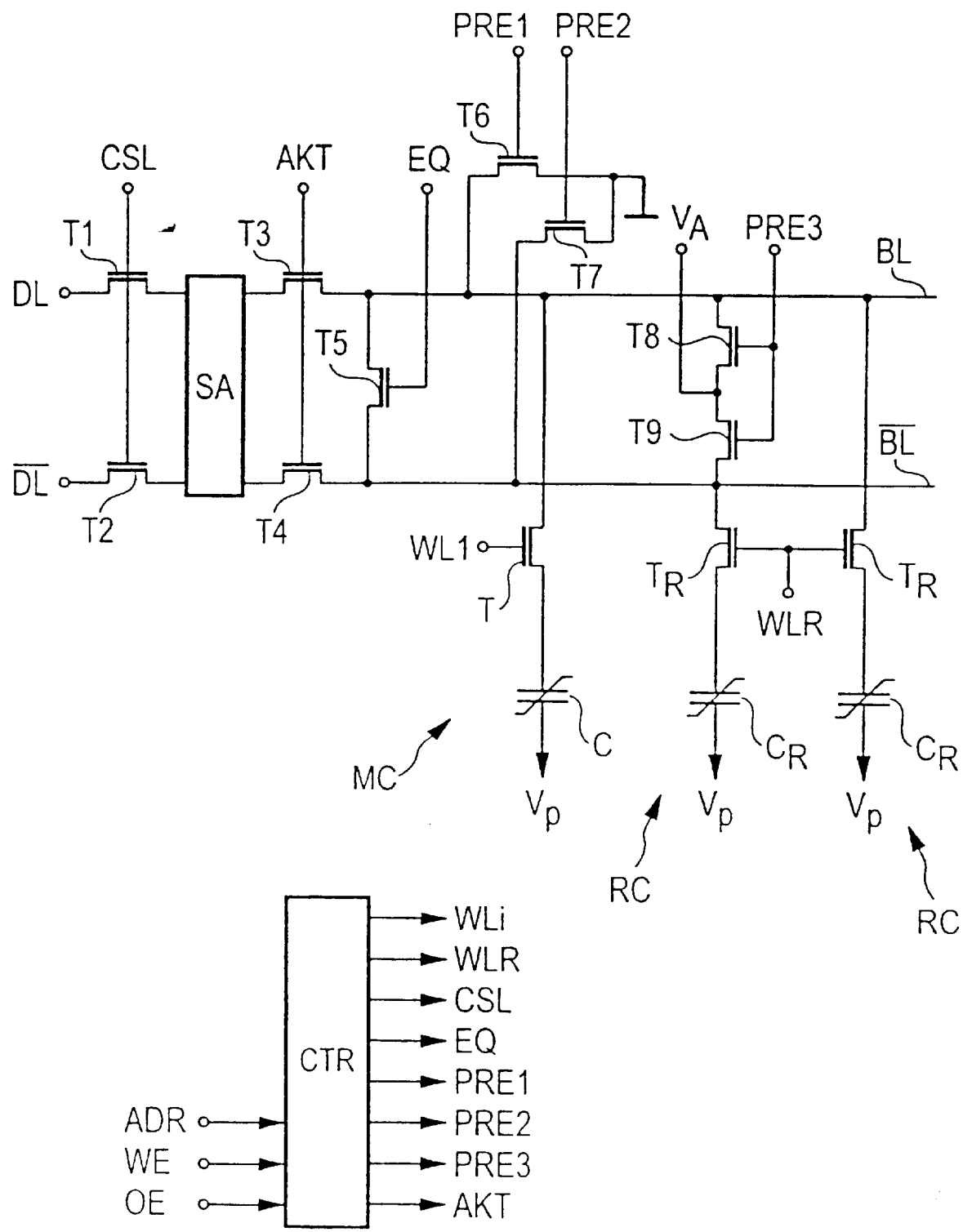
FIG. 1 is a schematic diagram of an exemplary embodiment of the integrated memory according to the invention.

Referring now to the figures of the drawing in detail and first, particularly, to FIG. 1 thereof, there are illustrated only the components of an FRAM which are required for understanding the invention. The FRAM has a differential sense amplifier SA which, by way of example, can be in the same form as the sense amplifier described in U.S. Pat. No. 5,241,503. The sense amplifier SA connects a differential data line pair DL, /DL to a differential bit line pair BL, /BL. The data line pair DL, /DL connects the sense amplifier SA to non-illustrated external connection terminals of the memory. The bit lines BL, /BL connect the sense amplifier SA to memory cells MC, only one of which is shown in FIG. 1. Each memory cell has a selection transistor T of the n-channel type and also a storage capacitor C having a ferroelectric dielectric. The selection transistor T and the storage capacitor C are arranged in a series circuit between one of the bit lines BL and a plate potential $V_p$. The gate of the selection transistor T is connected to a word line WL1. Each bit line BL, /BL is connected to a multiplicity of the memory cells MC. One of the memory cells is selected by means of the respective word line WL1.

In addition, each of the bit lines BL, /BL is connected to a reference cell RC, which is of the same design as the memory cells MC. Each reference cell RC therefore likewise has a selection transistor $T_R$ and a storage capacitor $C_R$, which have the same dimensions as the transistors T and capacitors C in the memory cells MC. The gates of the selection transistors $T_R$ of the reference cells RC are connected to a reference word line WLR.

The sense amplifier SA is connected to the data lines DL, /DL via a first transistor T1 and a second transistor T2. The gates of the second transistors T1, T2 are connected to a column select signal CSL, which can be activated on the basis of column addresses which can be applied to the memory. The sense amplifier SA is connected to the bit lines BL, /BL via a third transistor T3 and a fourth transistor T4. The gates of these two transistors T3, T4 are connected to an activation signal AKT. In addition, the two bit lines BL, /BL are connected to one another via a fifth transistor T5, whose gate is connected to an equalization signal EQ. In addition, the first bit line BL is connected to ground via a sixth transistor T6, whose gate is connected to a first precharge signal PRE1. The second bit line /BL is connected to ground via a seventh transistor T7, whose gate is connected to a second precharge signal PRE2.

In addition, the first bit line BL and the second bit line /BL are connected to one another via a series circuit comprising an eighth T8 and a ninth T9 transistor. The gates of these transistors T8, T9 are connected to a third precharge signal PRE3. A circuit node between the two transistors T8, T9 is connected to a precharge potential $V_A$. The transistors T1 to T9 in FIG. 1 are n-channel transistors.

While the column select signal CSL is active, the data are read from the sense amplifier onto the data lines DL, /DL in the case of a read access operation, whereas the data are impressed into the sense amplifier externally via the data lines DL, /DL in the case of a write access operation. In a conventional memory, a read access operation differs from a write access operation only in the direction in which the data are interchanged during activation of the column select signal CSL. The invention has other differences, which are explained below.

The memory has a control unit CTR to which memory cell addresses ADR, a write signal WE and a read signal OE are supplied. At its outputs, the control unit CTR produces the activation signal AKT, the equalization signal EQ, the column select signal CSL, the first precharge signal PRE1, the second precharge signal PRE2 and the third precharge signal PRE3. In addition, the outputs of the control unit CTR are connected to the word lines WLi and to the reference word line WLR. The control unit CTR activates the column select signal CSL and the word lines WLi on the basis of the supplied address ADR. The write signal WE is used to start a write access operation, and the read signal OE is used to start a read access operation. Depending on whether a read access operation or a write access operation is involved, the control unit CTR controls a large portion of its output signals in different ways. This is explained below with reference to FIG. 2.

FIG. 2 shows the potential profile of the potential on the two bit lines BL, /BL during a write access operation (left-hand half) and during a read access operation (right-hand half). It can be seen in FIG. 2 that, at the start of the write access operation, both bit lines BL, /BL have been precharged to the precharge potential $V_A$ =1.2 volts by means of the third precharge signal PRE3. Before the write access operation, the equalization signal EQ, the first precharge signal PRE1, the second precharge signal PRE2 and the reference word line WLR are not activated, so that the transistors connected to them are not turned on. In the case under consideration, a logic "0" is to be written to the memory cell MC from FIG. 1, which is connected to the first bit line BL. A corresponding differential data signal has already been transferred to the sense amplifier SA from outside the memory via the data lines DL, /DL and the first transistor T1 and the second transistor T2, which have been turned on by means of the column select signal CSL, and said sense amplifier SA produces a corresponding difference signal on its connections associated with the bit lines BL, /BL. Shortly after the instant 310 ns, the third transistor T3 and the fourth transistor T4 are turned on by means of the activation signal AKT, so that the sense amplifier SA forwards to the bit lines BL, /BL the difference signal which is to be written. The connection of the sense amplifier SA to the bit lines BL, /BL by means of the two transistors T3, T4 is also referred to as "activation" of the sense amplifier in this case.

It can be seen in FIG. 2 that, as a result of the sense amplifier being activated, the first bit line BL gradually assumes a low level of 0 volts, and the second bit line /BL gradually assumes a high level of 2.5 volts. Shortly before the instant 320 ns, the word line WL1 is brought to a high potential, so that the selection transistor T in the memory cell MC is conductively connected to the first bit line BL. Since, in this case, a logic "1" was stored in the memory cell MC before the selection transistor T turned off, a brief dip in the potential profile of the first bit line BL is produced at 320 ns. On account of the charge equalization between the first bit line BL and that electrode of the storage capacitor C which is connected to it, the logic "0" is reliably stored in the memory cell MC at approximately 330 ns.

From the instant 400 ns, FIG. 2 shows the execution of a read access operation to the memory cell MC in FIG. 1, in which a logic "0" has already been stored, as just described. At 410 ns, both bit lines BL, /BL are first discharged to ground via the sixth transistor T6 and the seventh transistor T7 on the basis of the first precharge signal PRE1 and the second precharge signal PRE2. At 420 ns, the reference cells RC are conductively connected to the respective bit line BL, /BL via the reference word line WLR. In this case, the reference cell RC connected to the first bit line BL was previously precharged to a logic "1", and the reference cell RC connected to the second bit line /BL was previously precharged to a logic "0". A different potential is therefore produced on the two bit lines BL, /BL after the instant 420 ns. The first PRE1 and the second PRE2 precharge signal again assume a low level, while at 430 ns the equalization signal EQ assumes a high level. As a result of this, charge equalization takes place on the two bit lines BL, /BL via the fifth transistor T5. At approximately 435 ns, after the equalization signal EQ has assumed a low level again, the first bit line BL is discharged to ground by connecting it to ground via the sixth transistor T6 using a high level of the first precharge signal PRE1. Not until shortly after 440 ns is the memory cell MC conductively connected to the first bit line BL via the word line WL1, which causes the potential on said first bit line to rise only slightly on account of the logic "0" stored in the memory cell MC. At 450 ns, the sense amplifier SA is activated by connecting it to the bit line pair BL, /BL using the transistors T3, T4 driven by means of the activation signal AKT. At this instant, the sense amplifier SA detects the arithmetic sign of the potential difference between the two bit lines BL, /BL and amplifies this difference signal, so that, shortly after 450 ns, the first bit line BL is at a low potential of 0 volts and the second bit line /BL is at a high potential of approximately 2.5 volts. The sense amplifier SA then forwards this amplified difference signal to the data lines DL, /DL via the transistors T1, T2 driven by means of the column select signal CSL. Since the selection transistor T is initially still turned on by means of its word line WL1 after the instant 450 ns, the read logic "0" is automatically written back to the memory cell MC again by the sense amplifier SA while the difference signal is being amplified. Shortly before 480 ns, the sense amplifier SA is deactivated again as a result of the activation signal AKT being at a low level. Next, the bit lines BL, /BL are again precharged to the precharge potential $V_A$ by means of the third precharge signal PRE3. Thereafter, a new write access operation or read access operation to one of the memory cells MC connected to the bit line pair BL, /BL can be performed.

In FIG. 2 it can be seen that the entire write access operation in this exemplary embodiment lasts only 40 ns, whereas the read access operation lasts virtually 80 ns. Hence, a write access operation in this memory is performed virtually twice as fast as a read access operation. This is achieved by virtue of the fact that, before the write access operation, the bit line precharging steps carried out for the read access operation are virtually completely dispensed with, up to the two bit lines being precharged to the precharge potential $V_A$. There is no longer discharging of the two bit lines to 0 volts by means of the two precharge signals PRE1, PRE2, reading of the reference memory cells RC via the reference word line WLR, the subsequent charge equalization between the bit lines BL, /BL by means of the equalization signal EQ and the discharge of the first bit line BL by means of the first precharge signal PRE1, shortly before the memory cell MC is conductively connected to the first bit line BL. These bit line precharging steps are necessary only for a read access operation in an FRAM and can therefore be dispensed with for write access. However, this requires that the signals needed for precharging be produced by the control unit CTR in a different manner during write access as compared with read access.

In a conventional memory, the time required for the write access operation would be just as long as that required for a read access operation. Since, in conventional memories, the type of memory access differs only in terms of whether or not an information item which is to be written is imposed on the sense amplifier SA from outside the memory when the select signal CSL is at a high level, the bit lines are precharged using the same respective steps for a write access operation and for a read access operation in conventional memories.

Since, in this exemplary embodiment, the reference cells RC are read only for each read access operation, but never for a write access operation, the number of access operations to the reference cells is advantageously less than in conventional FRAMs. Since FRAM memory cells are known to age on the basis of the memory cell access operations, the aging process of the reference cells in the memory described in this case is slowed down. Since each bit line BL has a large number of memory cells MC but only one reference cell associated with it, conventional FRAMs containing such reference cells involve these reference cells being accessed with each read access operation and with each write access operation. In the FRAM according to the invention, the reference cells RC are accessed only for the read access operations and not for a write access operation.

We claim:

1. An integrated memory, comprising:

writable memory cells;

a differential sense amplifier configured to transfer data read during a read access operation from said memory cells to outside the memory, and to transfer data to be written during a write access operation from outside the memory to said memory cells;

a pair of bit lines connecting said memory cells to said differential sense amplifier;

a control unit connected to said bit lines for precharging said bit lines in a given number of steps before one of said memory cells is conductively connected to one of said bit lines for a read access operation; and said control unit precharging said bit lines during a write access operation with fewer than the given number of steps before said sense amplifier transfers data to said bit line pair.

2. The integrated memory according to claim 1, wherein memory cell contents of said memory cells are destroyed during a read access operation; and said sense amplifier amplifies a difference signal established on said bit line pair when said memory cell has been conductively connected to said bit line during the read access operation, and then writes the difference signal back to said memory cell.

3. The integrated memory according to claim 1, wherein said control unit, in order to precharge said bit lines for the read access operation, precharges both bit lines of said bit line pair to a common potential, and the common potential is dispensed with for the write access operation.

4. The integrated memory according to claim 1, which further comprises a plurality of reference memory cells, and wherein said control unit performs two operations for the read access operation for precharging said bit lines, including reading out said reference memory cells onto said bit lines and then performing a charge equalization between said bit lines, and wherein both operations are dispensed with for a write access operation.

5. The integrated memory according to claim 4, wherein said control unit, in order to precharge said bit lines for the read access operation, discharges the bit line connected to said memory cell which is to be read, the discharge being effected subsequently to the charge equalization between said bit lines and being dispensed with for the write access operation.

6. The integrated memory according to claim 1, wherein during the read access operation, the respective said memory cell is read by conductively connecting said memory cell to one of said bit lines before said sense amplifier is activated; and during a write access operation, said sense amplifier is activated first, so that data to be written are already present on said bit line pair before the respective said memory cell is conductively connected to one of said bit lines.

* * * * *